United States Patent
Ono (10) Patent No.: US 12,236,989 B2
(45) Date of Patent: Feb. 25, 2025

(54) LAYER STRUCTURE FOR MAGNETIC MEMORY ELEMENT, MAGNETIC MEMORY ELEMENT, MAGNETIC MEMORY DEVICE, AND METHOD FOR STORING DATA IN MAGNETIC MEMORY ELEMENT

(71) Applicant: KYOTO UNIVERSITY, Kyoto (JP)

(72) Inventor: Teruo Ono, Kyoto (JP)

(73) Assignee: KYOTO UNIVERSITY, Kyoto (JP)

(*) Notice: Subject to any disclaimer, the term of this patent is extended or adjusted under 35 U.S.C. 154(b) by 170 days.

(21) Appl. No.: 18/015,455

(22) PCT Filed: Jul. 12, 2021

(86) PCT No.: PCT/JP2021/026111
§ 371 (c)(1),
(2) Date: Jan. 10, 2023

(87) PCT Pub. No.: WO2022/014529
PCT Pub. Date: Jan. 20, 2022

(65) Prior Publication Data
US 2023/0282262 A1    Sep. 7, 2023

(30) Foreign Application Priority Data

Jul. 15, 2020 (JP) ................................ 2020-121198

(51) Int. Cl.
| | |
|---|---|
| G11C 11/16 | (2006.01) |
| H10B 61/00 | (2023.01) |
| H10N 50/10 | (2023.01) |

(52) U.S. Cl.
CPC ........ *G11C 11/161* (2013.01); *G11C 11/1673* (2013.01); *G11C 11/1675* (2013.01); *H10B 61/00* (2023.02); *H10N 50/10* (2023.02)

(58) Field of Classification Search
None
See application file for complete search history.

(56) References Cited

U.S. PATENT DOCUMENTS

| | | | |
|---|---|---|---|
| 6,834,005 | B1 | 12/2004 | Parkin |
| 7,936,597 | B2 | 5/2011 | Clinton et al. |

(Continued)

FOREIGN PATENT DOCUMENTS

| | | |
|---|---|---|
| JP | 2002208681 A | 7/2002 |
| JP | 2009239282 A | 10/2009 |

(Continued)

OTHER PUBLICATIONS

International Search Report for International Application No. PCT/JP2021/026111 dated Sep. 14, 2021, 4 pages including English translation.

(Continued)

*Primary Examiner* — Tan T. Nguyen
(74) *Attorney, Agent, or Firm* — MH2 Technology Law Group, LLP (57) ABSTRACT

The present invention provides a layer structure for a magnetic memory element in which the drive current required for domain wall motion is reduced, and the controllability of domain wall motion is improved, and provides a magnetic memory element having the layer structure. A layer structure (9) for a magnetic memory element (10) comprises multiple first ferromagnetic layers (1) with a switchable spin state and boundary layers (2) each located between each pair of the multiple first ferromagnetic layers (1) to form a domain wall, the boundary layers (2) being for generating ferromagnetic interaction (Aex) between the multiple first ferromagnetic layers (1).

6 Claims, 7 Drawing Sheets

(56) References Cited

U.S. PATENT DOCUMENTS

| | | | |
|---|---|---|---|
| 8,698,259 B2* | 4/2014 | Krounbi | H01F 10/3254 |
| | | | 365/158 |
| 9,214,169 B1* | 12/2015 | Kaiser | G01R 33/098 |
| 10,056,430 B1* | 8/2018 | Mihajlovic | H10N 50/85 |
| 2009/0244957 A1 | 10/2009 | Clinton et al. | |
| 2011/0116306 A1* | 5/2011 | Suzuki | G11C 11/161 |
| | | | 365/158 |
| 2012/0250406 A1 | 10/2012 | Morise et al. | |
| 2014/0009994 A1* | 1/2014 | Parkin | G11C 11/161 |
| | | | 365/80 |
| 2015/0055404 A1 | 2/2015 | Morise et al. | |
| 2018/0328902 A1* | 11/2018 | Tseng | G01N 33/005 |
| 2019/0355401 A1 | 11/2019 | Shiokawa | |
| 2021/0158849 A1 | 5/2021 | Saito et al. | |
| 2022/0115440 A1* | 4/2022 | Saito | H01F 10/329 |
| 2023/0170007 A1* | 6/2023 | Guan | G11C 19/0808 |
| | | | 365/158 |

FOREIGN PATENT DOCUMENTS

| | | | |
|---|---|---|---|
| JP | 2012212715 A | 11/2012 | |
| JP | 2018026481 A | 2/2018 | |
| JP | 2019204948 A | 11/2019 | |
| WO | 2019203132 A1 | 10/2019 | |

OTHER PUBLICATIONS

Ahern et al., "The spontaneous magnetization of nickel + copper alloys", Proc. Math. Phys. Eng. Sci., 1958, vol. 248, No. 1253, pp. 145-152.

* cited by examiner

LAYER STRUCTURE FOR MAGNETIC MEMORY ELEMENT, MAGNETIC MEMORY ELEMENT, MAGNETIC MEMORY DEVICE, AND METHOD FOR STORING DATA IN MAGNETIC MEMORY ELEMENT

CROSS-REFERENCE TO RELATED APPLICATIONS

This application is a U.S. National Stage application of PCT/JP2021/026111 filed 12 Jul. 2021, which claims priority to Japanese application No. 2020-121198 filed 15 Jul. 2020, the entire disclosures of which are hereby incorporated by reference in their entireties.

TECHNICAL FIELD

The present invention relates to a magnetic memory element. More specifically, the present invention relates to a layer structure for a magnetic memory element for transmitting information based on domain wall motion, a magnetic memory element, a magnetic memory device, and a method for storing data in a magnetic memory element.

BACKGROUND ART

The dramatic increase in the amount of information requires memory devices capable of recording information at high densities. Flash memory is currently widely used as such a memory device. However, due to its operating principle, flash memory has disadvantages such that the number of writable cycles is limited as a result of degradation of the oxide film, and such that the write speed decreases while information is written repeatedly. In view of this, various magnetic memories have recently been proposed as alternatives to existing flash memories.

For example, Patent Literature (PTL) 1 discloses a linear racetrack memory proposed as a three-dimensional magnetic memory. Further, PTL 2 discloses a magnetic storage device that uses spin-transfer torque as a recording technique.

In the racetrack memory of PTL 1, a ferromagnetic material is divided into magnetic domains and arranged in stacks or lines. Bits are defined per magnetic domain, and data are stored according to the direction of magnetization in the magnetic domains. In the magnetic storage device of PTL 2, current is passed from a current source to the stack to induce spin-momentum transfer to exert torque between adjacent magnetic layers at each position, whereby the direction of magnetization is determined, and data bits are stored.

CITATION LIST

Patent Literature

PTL 1: U.S. Pat. No. 6,834,005
PTL 2: JP2009-239282A

SUMMARY OF INVENTION

Technical Problem

In the racetrack memory of PTL 1, domain walls are moved by passing a current through ferromagnetic thin wires (magnetic nanowires). This causes the magnetization in each magnetic domain to move simultaneously in one direction to allow data to be transmitted. In the magnetic storage device of PTL 2, although spin-transfer torque is used for the recording technique, domain walls are not formed in the stack memory.

The information transmission techniques based on domain wall motion as disclosed in PTL 1 still suffer from problems, such as high drive current for domain wall motion and poor controllability of domain wall motion. Accordingly, magnetic memory elements are required to achieve a reduction in the drive current required for domain wall motion and an improvement in the controllability of domain wall motion.

An object of the present invention is to provide a layer structure for a magnetic memory element in which the drive current required for domain wall motion is reduced, and the controllability of domain wall motion is improved, and to provide a magnetic memory element comprising the layer structure.

Solution to Problem

To solve the above problem, for example, the present invention encompasses the following embodiments.
Item 1.
A layer structure for a magnetic memory element comprising
multiple first ferromagnetic layers with a switchable spin state, and
boundary layers each disposed between each pair of the multiple first ferromagnetic layers to form a domain wall,
the boundary layers being for generating ferromagnetic interaction between the multiple first ferromagnetic layers.
Item 2.
The layer structure according to Item 1, wherein the boundary layers are formed using a non-magnetic material.
Item 3.
The layer structure according to Item 1, wherein the boundary layers are formed using a ferromagnetic material different from the first ferromagnetic layers.
Item 4.
A magnetic memory element comprising
the layer structure of any one of Items 1 to 3,
a second ferromagnetic layer with a switchable spin state disposed on one side of the first ferromagnetic layers, via one of the boundary layers,
a first electrode disposed adjacent to the second ferromagnetic layer to switch the spin state of the second ferromagnetic layer by spin-orbit torque, and
a second electrode disposed on another side of the first ferromagnetic layers that is most distant from the one side.
Item 5.
The magnetic memory element according to Item 4, wherein the second ferromagnetic layer has coercivity higher than that of the first ferromagnetic layers.
Item 6.
The magnetic memory element according to Item 4 or 5, further comprising
an insulating film disposed between one of the first ferromagnetic layers on the another side that is most distant from the one side and the second electrode, and
a third ferromagnetic layer with a fixed spin state disposed between the insulating film and the second electrode, wherein the spin state of the one of the first ferromagnetic layers on the another side is read out through the second electrode.

Item 7.

A magnetic memory device comprising
the magnetic memory element of Item 6,
a current source for passing a current through the first electrode, and from the second electrode to the first electrode, and
a sensor for reading data that is represented by a spin state and that is stored in the magnetic memory element.

Item 8.

A method for storing data represented by a spin state in the magnetic memory element of any one of Items 4 to 6, comprising
passing a current through the first electrode to set a spin state of the second ferromagnetic layer by spin-orbit torque, and
passing a current between the second electrode and the first electrode to transfer the spin state of the second ferromagnetic layer to one of the first ferromagnetic layers on one side by spin-transfer torque.

Advantageous Effects of Invention

The present invention provides a layer structure for a magnetic memory element in which the drive current required for domain wall motion is reduced, and the controllability of domain wall motion is improved, and provides a magnetic memory element comprising the layer structure.

DESCRIPTION OF EMBODIMENTS

Embodiments of the present invention are described in detail below with reference to the accompanying drawings. In the following description and the drawings, the same symbols indicate the same or similar constituent elements, and redundant explanations for the same or similar constituent elements will be omitted.

Memory Element Configuration

Figure 1:
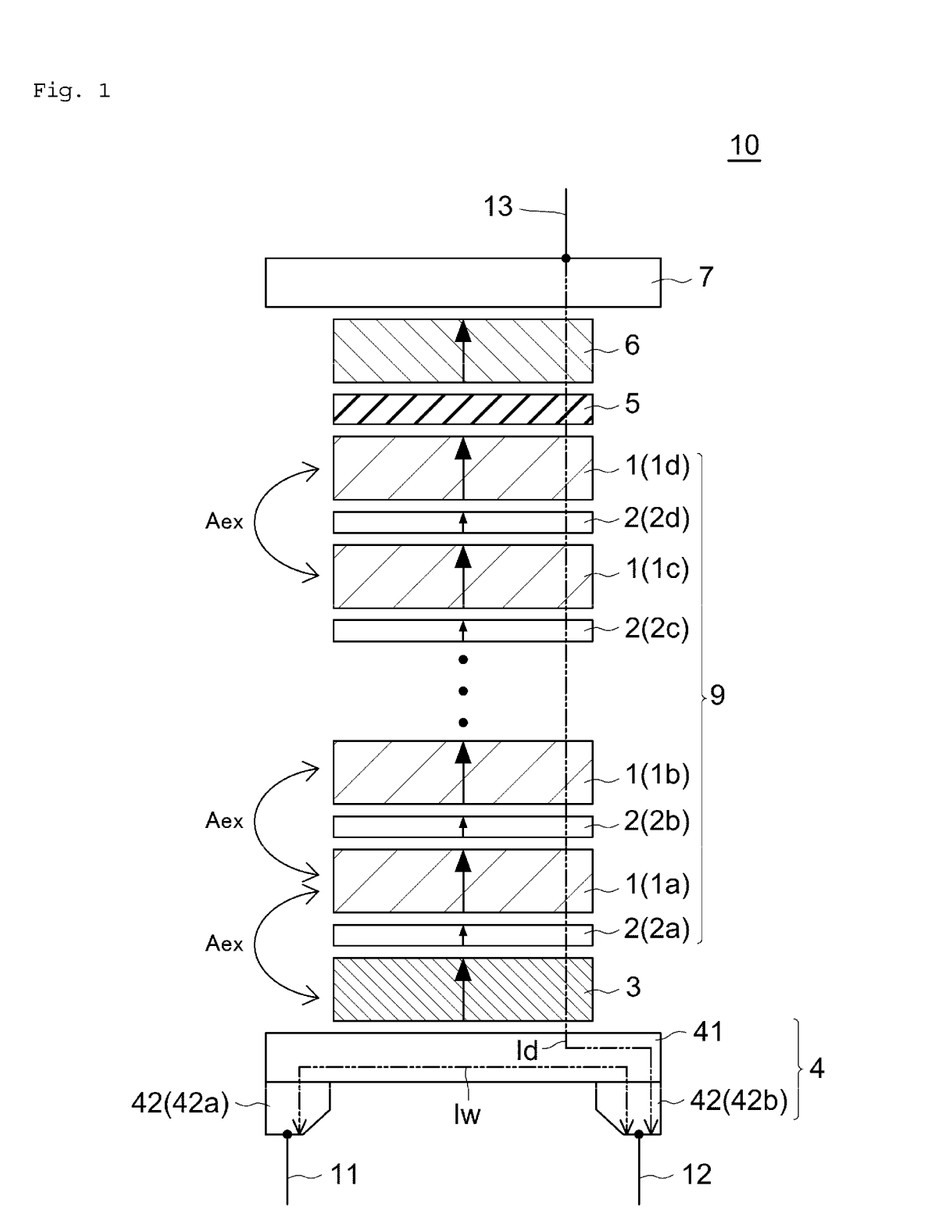
FIG. 1 is a schematic cross-sectional view of the configuration of a magnetic memory element according to one embodiment of the present invention.

FIG. 1 is a schematic cross-sectional view of the configuration of a magnetic memory element according to one embodiment of the present invention.

A magnetic memory element 10 according to one embodiment of the present invention comprises multiple first ferromagnetic layers 1 (1a to 1d), multiple boundary layers 2 (2a to 2d), a second ferromagnetic layer 3, a first electrode 4, an insulating film 5, a third ferromagnetic layer 6, and a second electrode 7. The magnetic memory element 10 shown as an example has a three-dimensional structure in which the second ferromagnetic layer 3, a layer structure 9 of the multiple boundary layers 2 and the multiple first ferromagnetic layers 1, the insulating film 5, and the third ferromagnetic layer 6 are stacked in this order from the bottom of the drawing between the first electrode 4 and the second electrode 7.

The multiple first ferromagnetic layers 1 (1a to 1d) are ferromagnetic layers with a switchable spin state. In the shown embodiment, the spin state can have two states; i.e., the arrows of spin can point upward or downward, for example. A single first ferromagnetic layer 1 functions as a memory cell for storing one bit of binary information. For example, the first ferromagnetic layer 1 may be formed using an elemental metal, such as iron or cobalt, or an alloy of these metals, such as $Fe_{1-x}Ni_x$, $Fe_{1-x}Co_x$, $Co_{1-x}Pt_x$, or CoFeB, wherein x is a composition ratio of the alloy and is a value in the range of 0<x<1.

The boundary layers 2 are each disposed between each pair of the multiple first ferromagnetic layers 1 to form a domain wall. In the shown embodiment, the spin state of the boundary layer 2 can have three states; i.e., the arrows of spin can point upward, downward, or horizontal, for example. When a domain wall is formed in the boundary layer 2, the spin state of the boundary layer 2 is represented by a horizontal arrow. For convenience of explanation, the horizontal spin arrows only point to the right. In the present embodiment, the boundary layer 2 is formed using a non-magnetic material. For example, the non-magnetic material of the boundary layer 2 may be an elemental metal that is not ferromagnetic, such as copper or platinum, or an alloy of cobalt and platinum whose composition has been controlled as described below. In the present embodiment, although the boundary layer 2 is a non-magnetic material, since the thickness thereof is made thin, the boundary layer 2 is formed into a ferromagnetic material with a small exchange stiffness constant due to proximity effects caused by the ferromagnetic layers (the first ferromagnetic layers 1 or the second ferromagnetic layer 3) adjacent to the boundary layer 2.

The layer structure 9 is explained here, focusing on a single boundary layer 2 and a pair of the first ferromagnetic layers 1 (1a, 1b) sandwiching the boundary layer 2. In the layer structure 9 for the magnetic memory element 10 according to one embodiment, each of the boundary layers 2 generates ferromagnetic interaction (magnetic stiffness) Aex between the multiple first ferromagnetic layers 1. More specifically, the boundary layer 2 has a thickness or composition that is sufficient to generate the ferromagnetic interaction Aex between the multiple first ferromagnetic layers 1. The ferromagnetic interaction Aex is an interaction by which the spin direction is aligned. The ferromagnetic interaction Aex generated between the multiple first ferromagnetic layers 1 achieves a reduction in the drive current required for domain wall motion and improves the controllability of domain wall motion in the magnetic memory element 10. The ferromagnetic interaction Aex is also generated between the first ferromagnetic layer 1*a* and the second ferromagnetic layer 3 sandwiching the boundary layer 2.

When an elemental metal is used for the non-magnetic material of the boundary layer 2, an elemental metal with a thickness that is sufficient to generate the ferromagnetic interaction Aex between the multiple first ferromagnetic layers 1 is used to form the boundary layer 2. For example, when copper is used to form the boundary layer 2, the thickness of the boundary layer 2 is preferably a thickness within the range equivalent to one to three copper atoms. More preferably, the thickness of the boundary layer 2 is a thickness within the range equivalent to one to two copper atoms. For example, when platinum is used to form the boundary layer 2, the thickness of the boundary layer 2 is preferably a thickness within the range equivalent to one to four platinum atoms. More preferably, the thickness of the boundary layer 2 is a thickness within the range equivalent to one to three platinum atoms.

When an alloy is used for the non-magnetic material of the boundary layer 2, an alloy with a composition that is sufficient to generate the ferromagnetic interaction Aex between the multiple first ferromagnetic layers 1 is used to form the boundary layer 2. By controlling the composition ratio of the alloy used to form the boundary layer 2, the magnitude of the ferromagnetic interaction Aex that is generated between the multiple first ferromagnetic layers 1 is controlled. The Curie temperature Tc refers to a transition temperature at which a material changes from ferromagnetic to paramagnetic. Thus, whether the alloy exhibits properties of ferromagnetic materials or paramagnetic materials (i.e. non-magnetic materials) can be controlled by controlling the Curie temperature Tc of the alloy. The Curie temperature Tc and the ferromagnetic interaction Aex are proportionate. On the other hand, the Curie temperature Tc of the alloy can be controlled by controlling the composition ratio of the alloy. For example, the compositional dependence of the Curie temperature Tc in $Ni_{1-x}Cu_x$ alloy is described in FIG. 3 in S. A. Ahern, M. J. C. Martin and Willie Sucksmith, "The spontaneous magnetization of nickel+copper alloys," Proc. Math. Phys. Eng. Sci., United Kingdom, The Royal Society, 11 Nov. 1958, Volume 248, Issue 1253, pp. 145-152, https://doi.org/10.1098/rspa.1958.0235. The same control can be applied not only to the $Ni_{1-x}Cu_x$ alloys disclosed as an example in this article but also to $Co_{1-x}Pt_x$ alloys. That is, by controlling the composition ratio of the alloy used to form the boundary layer 2, the Curie temperature Tc of the alloy can be controlled, and whether the alloy exhibits properties of ferromagnetic materials or paramagnetic materials can be controlled, whereby the magnitude of the ferromagnetic interaction Aex can be controlled.

The second ferromagnetic layer 3 is a ferromagnetic layer with a switchable spin state. The second ferromagnetic layer 3 is disposed on the side of the first ferromagnetic layer 1*a*, which is located on the lower side of drawing in the layer structure 9, via one of the boundary layers 2. The second ferromagnetic layer 3 functions as a layer for writing one bit of binary information to the first ferromagnetic layer 1*a*. For example, the second ferromagnetic layer 3 may be formed using an alloy of cobalt and platinum or an alloy of iron and nickel. The material of the second ferromagnetic layer 3 for use may be various materials used for fixed magnetic layers in magnetoresistive random-access memories (MRAMs).

The second ferromagnetic layer 3 has coercivity higher than that of the first ferromagnetic layers 1. For example, the second ferromagnetic layer 3 has coercivity higher than that of the first ferromagnetic layers 1 when at least one of the following three conditions is satisfied. The first condition is that the second ferromagnetic layer 3 and the first ferromagnetic layer 1 are formed using the same material, and that the second ferromagnetic layer 3 is thicker than the first ferromagnetic layer 1. The second condition is that the thickness of the second ferromagnetic layer 3 and the thickness of the first ferromagnetic layer 1 are the same, and that the second ferromagnetic layer 3 is formed using a material with magnetic anisotropy higher than that of the first ferromagnetic layer 1. The third condition is that the second ferromagnetic layer 3 is thinner than the first ferromagnetic layer 1, that the second ferromagnetic layer 3 is formed using a material with magnetic anisotropy sufficiently higher than that of the first ferromagnetic layer 1, and that the coercivity of the second ferromagnetic layer 3 is thus higher than that of the first ferromagnetic layer 1.

The first electrode 4 is disposed adjacent to the second ferromagnetic layer 3 to switch the spin state of the second ferromagnetic layer 3 by spin-orbit torque. The first electrode 4 comprises a spin-orbit torque (SOT) layer 41 and two bottom electrodes 42 (42*a*, 42*b*) electrically connected to the spin-orbit torque layer 41.

When a drive current for switching the spin state of the second ferromagnetic layer 3 is passed between terminals 11 and 12 of the first electrode 4, a write current Iw shown in the drawing as a single dotted line passes through the spin-orbit torque layer 41, and the spin state of the second ferromagnetic layer 3 is switched by spin-orbit torque generated by spin orbital interaction. The spin state of the second ferromagnetic layer 3 is determined according to the direction of the write current Iw. In the present embodiment, the write current Iw is pulsed. For example, the spin-orbit torque layer 41 may be formed using a heavy metal, such as platinum. The bottom electrodes 42 may be formed using various conductive metals, such as gold and copper.

The insulating film 5 and the third ferromagnetic layer 6 are used in combination with the first ferromagnetic layer 1*d* located on the upper side of the drawing in the layer structure 9 to function as a magnetic tunnel junction (MTJ) for reading out the spin state of the first ferromagnetic layer 1*d*. The first ferromagnetic layer 1*d* functions as the free layer of the magnetic tunnel junction. The spin state of the first ferromagnetic layer 1*d* is read out by measuring the magnitude of the current passing through the first ferromagnetic layer 1*d*, the insulating film 5, and the third ferromagnetic layer 6. The method for reading out the spin state with a magnetic tunnel junction is well known, and a further detailed description therefor is thus omitted here.

The insulating film 5 functions as the tunnel layer of the magnetic tunnel junction. The insulating film 5 is disposed between the first ferromagnetic layer 1*d* located on the upper side of the drawing in the layer structure 9 and the second electrode 7. The third ferromagnetic layer 6 is a layer with a fixed spin state (in the shown embodiment, the arrow points upward) and functions as the fixed layer of the magnetic tunnel junction. In the present embodiment, the arrow of spin representing the spin state of the third ferromagnetic layer 6 is fixed to point upward. The third ferromagnetic layer 6 is disposed between the insulating film 5 and the second electrode 7. The insulating film 5 may be formed using an oxide film, such as magnesium oxide (MgO). The third ferromagnetic layer 6 may be formed using, for example, CoFeB, which is an alloy of cobalt, iron, and boron. The material of the third ferromagnetic layer 6 for use may be various materials used for fixed magnetic layers in MRAMs.

The second electrode 7 reads out the spin state of the first ferromagnetic layer 1*d* located on the upper side of the drawing in the layer structure 9. The second electrode 7 is disposed adjacent to the third ferromagnetic layer 6 and on the side of the first ferromagnetic layer 1*d*, which is located on the upper side of the drawing.

A drive current for moving domain walls is passed between either the terminal 11 or 12 of the first electrode 4 and the terminal 13 of the second electrode 7 to allow a domain wall drive current Id shown in the drawing as a single dotted line to pass between the second electrode 7 and the first electrode 4. This can allow domain walls to move between the multiple boundary layers 2 (2*a* to 2*d*) located between the second electrode 7 and the first electrode 4, and allow the spin state of each of the multiple first ferromagnetic layers 1 (1*a* to 1*d*) to be shifted in a racetrack fashion to be transferred sequentially. The insulating film 5 and the third ferromagnetic layer 6 function as a magnetic tunnel junction for readout, whereby the spin state of the first ferromagnetic layer 1*d*, which is located on the upper side of the drawing in the layer structure 9, is read out through the second electrode 7. In the present embodiment, the domain wall drive current Id is pulsed. For example, the second electrode 7 may be formed using various conductive metals, such as gold and copper.

Operation of Memory Element

Figure 2:
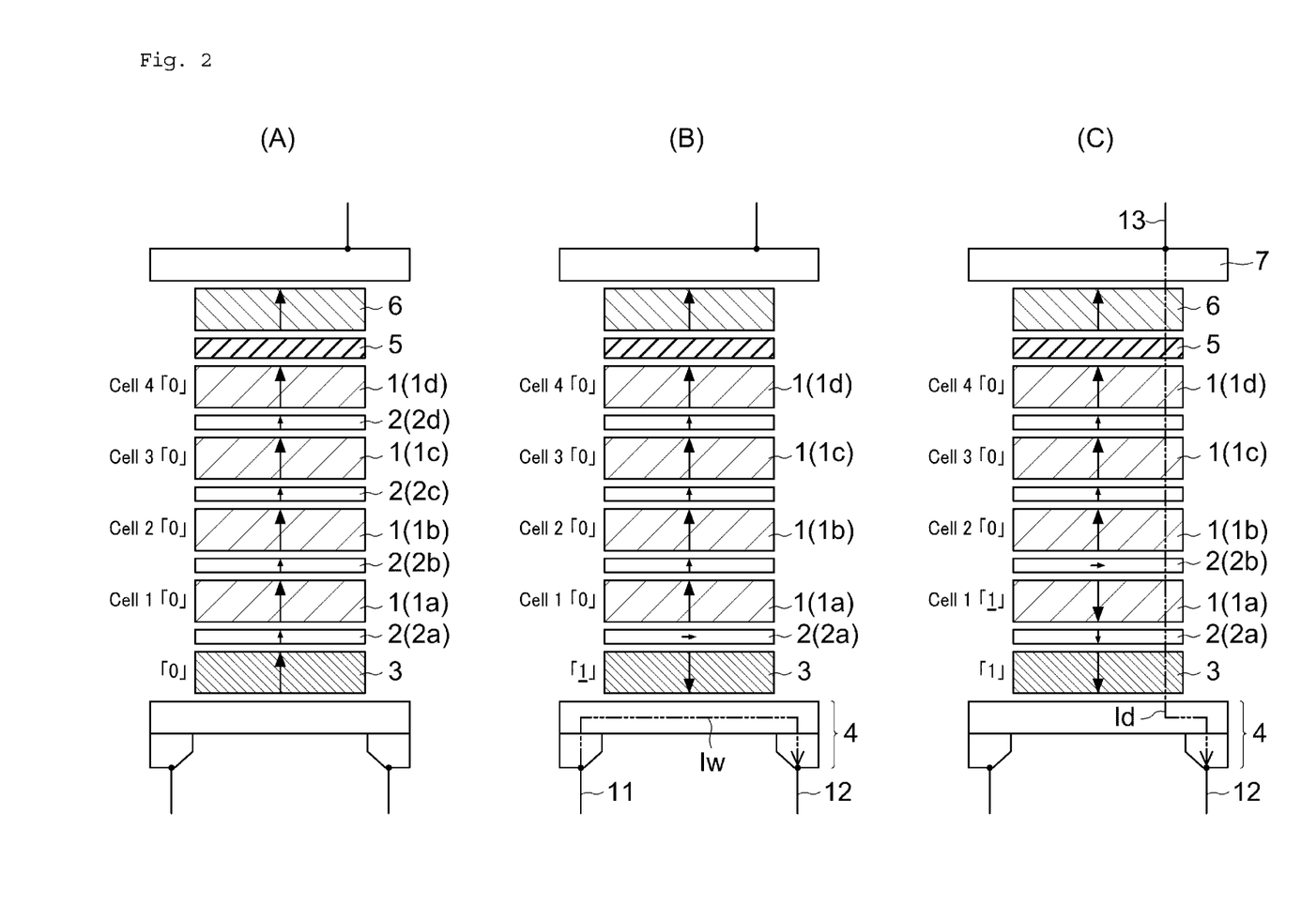
FIG. 2 is a schematic diagram for explaining the operation of a magnetic memory element according to one embodiment of the present invention.
Figure 3:
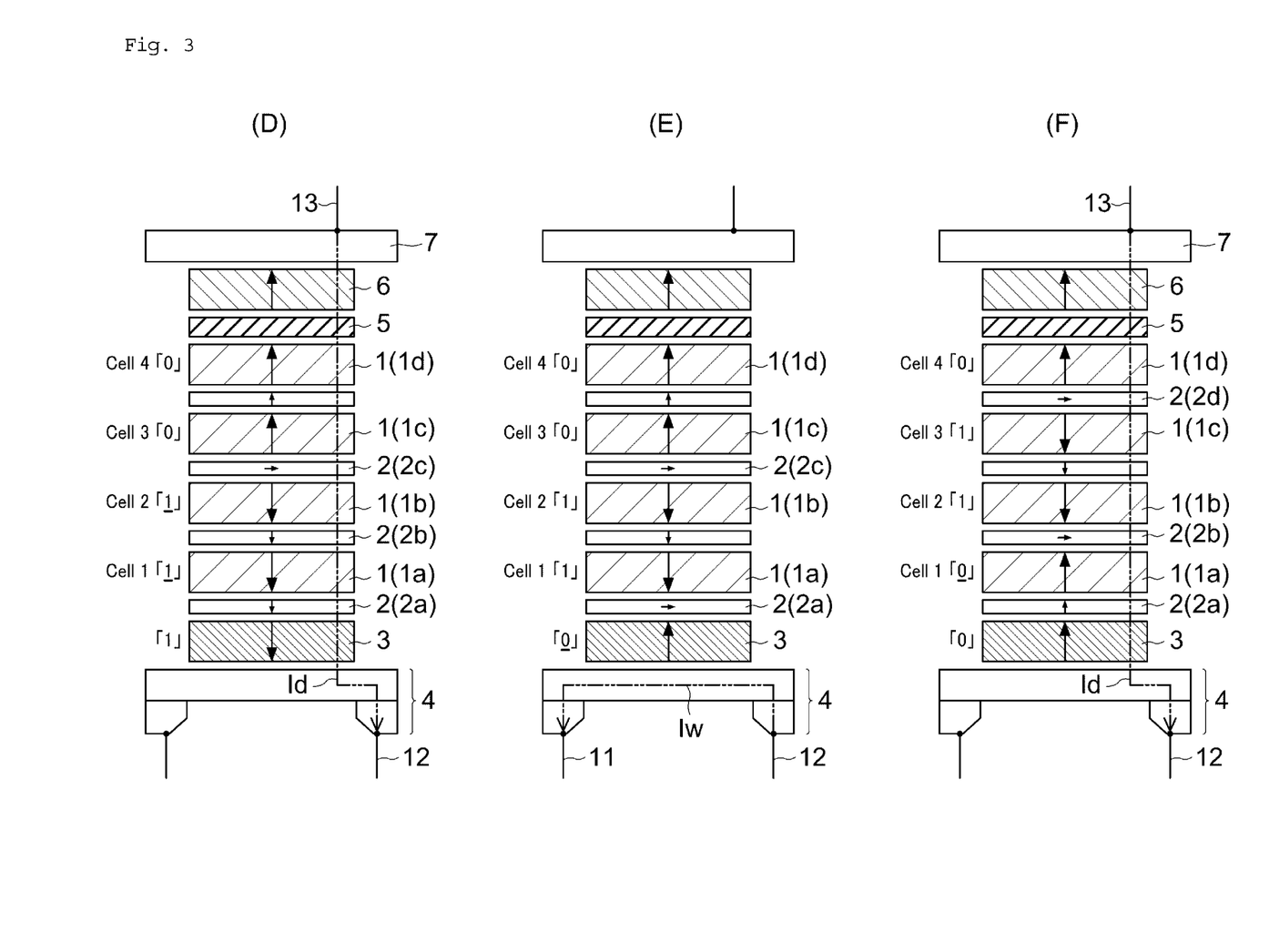
FIG. 3 is a schematic diagram for explaining the operation of a magnetic memory element according to one embodiment of the present invention.
Figure 4:
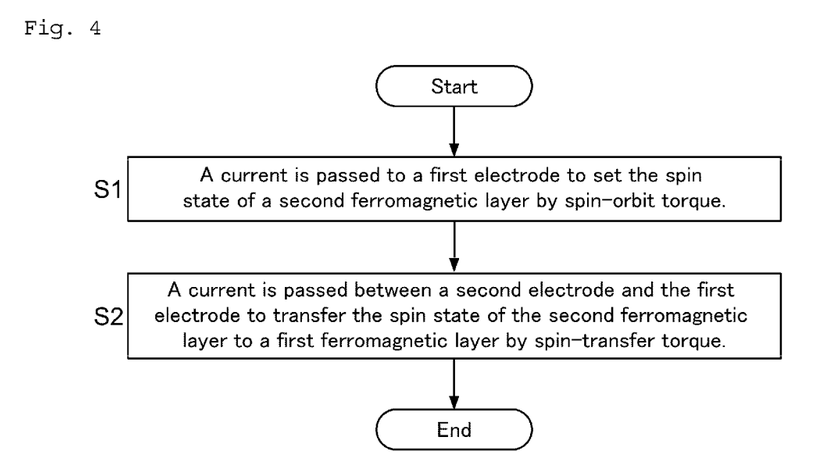
FIG. 4 is a flowchart for explaining the procedure for storing data in a magnetic memory element according to one embodiment of the present invention.

FIGS. 2 and 3 are schematic diagrams for explaining the operation of a magnetic memory element according to one embodiment of the present invention. FIG. 4 is a flowchart for explaining the procedure for storing data in a magnetic memory element according to one embodiment of the present invention.

A method for storing data in the magnetic memory element 10 according to one embodiment comprises
  passing a current between the bottom electrode 42*a* and 42*b* of the first electrode 4 to set the spin state of the second ferromagnetic layer 3 by spin-orbit torque (step S1), and
  passing a domain wall drive current Id between the second electrode 7 and the first electrode 4 to transfer the spin state of the second ferromagnetic layer 3 to the first ferromagnetic layer 1 (*id*) by spin-transfer torque (step S2).

Referring now to FIGS. 2 and 3, the procedure shown in FIG. 4 for storing data in the magnetic memory element 10 according to one embodiment and the procedure for reading data from the magnetic memory element 10 are explained. In the embodiment shown as an example, the magnetic memory element 10 comprises four memory cells (cell No. 1 to cell No. 4) and stores four bits of binary information in total. For convenience of explanation, an upward-pointing spin arrow represents the value "0," while a downward-pointing spin arrow represents the value "1."

Initialization of Data

FIG. 2(A) shows the state in which the magnetic memory element 10 is initialized. In each of the four first ferromagnetic layers 1 and the second ferromagnetic layer 3, the spin arrow is pointing upward, indicating that the value "0" is stored. In each of the four boundary layers 2, the spin arrow is also pointing upward, indicating that no domain walls are formed in the boundary layers 2 in the initialized state. The initialization of the magnetic memory element 10 can be done, for example, by continuously passing, a predetermined number of times, a pulsed domain wall drive current Id from the first electrode 4 to the second electrode 7. The spin state of the third ferromagnetic layer 6 is fixed upward in the present embodiment and is not changed by initialization.

Writing of Data

Writing of data in the magnetic memory element 10 is done through the second ferromagnetic layer 3. In the present embodiment, the second ferromagnetic layer 3 is disposed below the layer structure 9. For this reason, the writing of data is done from the first ferromagnetic layer 1*a* corresponding to cell No. 1. To write the value "1" in cell No. 1, first, the value "1" is set in the second ferromagnetic layer 3. Next, the value "1" set in the second ferromagnetic layer 3 is transferred to cell No. 1.

As shown in FIG. 2(B), when the write current Iw is passed to the right through the first electrode 4, the spin state of the second ferromagnetic layer 3 is switched with the spin arrow being changed from pointing upward to pointing downward by spin-orbit torque generated by the write current Iw. The value "1" is set and stored in the second ferromagnetic layer 3 accordingly. Along with this, a domain wall is formed in the boundary layer 2*a*, which is located between the second ferromagnetic layer 3 and the first ferromagnetic layer 1*a*.

As shown in FIG. 2(C), when a pulsed domain wall drive current Id is passed from the second electrode 7 to the first electrode 4, the domain wall formed in the boundary layer 2*a* moves to the boundary layer 2*b*, which is located between the first ferromagnetic layer 1*a* and the first ferromagnetic layer 1*b*. Thus, the domain wall motion induced by spin-transfer torque generated by the domain wall drive current Id sequentially transfers the spin state of each of the second ferromagnetic layer 3 and the four first ferromagnetic layers 1 (1*a* to 1*d*) to the upper layer shown in the drawing. Accordingly, the sequential spin state transfer accompanied by domain wall motion induced by spin-transfer torque causes the spin state of the second ferromagnetic layer 3 to be transferred to the first ferromagnetic layer 1*a*; thus, the spin state of the first ferromagnetic layer 1*a* is switched with the spin arrow being changed from pointing upward to pointing downward. The value "1" set in the second ferromagnetic layer 3 is written to the first ferromagnetic layer 1*a*, and the value "1" is stored in cell No. 1. Likewise, the sequential spin state transfer causes the value stored in cell No. 1 to be transferred to and stored in cell No. 2, the value stored in cell No. 2 to be transferred to and stored in cell No. 3, and the value stored in cell No. 3 to be transferred to and stored in cell No. 4.

If the pulsed domain wall drive current Id is passed from the first electrode 4 to the second electrode 7 in the direction opposite to that shown in the drawing, the spin state of each of the second ferromagnetic layer 3 and the four first ferromagnetic layers 1 (1*a* to 1*d*) will be sequentially transferred to the lower layer in the drawing by domain wall motion induced by spin-transfer torque generated by the domain wall drive current Id. In the present embodiment, the second ferromagnetic layer 3 for use in writing data is disposed below the layer structure 9, and the insulating film 5 and the third ferromagnetic layer 6 for use in reading data as described below are disposed above the layer structure 9. Therefore, the domain wall drive current Id is passed from the second electrode 7 to the first electrode 4 to sequentially transfer the spin state to the upper layer in the drawing.

As shown in FIG. 3(D), when the pulsed domain wall drive current Id is continuously passed from the second electrode 7 to the first electrode 4, the domain wall formed in the boundary layer 2*b* moves to the boundary layer 2*c*, which is located between the first ferromagnetic layer 1*b* and the first ferromagnetic layer 1c, and the sequential spin state transfer described with reference to FIG. 2(C) also continues. The spin state of the first ferromagnetic layer 1a is transferred to the first ferromagnetic layer 1b, and the spin state of the first ferromagnetic layer 1b is switched with the spin arrow being changed from pointing upward to pointing downward. The value "1" stored in the first ferromagnetic layer 1a is transferred to the first ferromagnetic layer 1b, and the value "1" is stored in cell No. 2.

Accordingly, while the value "1" is set in the second ferromagnetic layer 3, the value "1" set in the second ferromagnetic layer 3 is written to the first ferromagnetic layer 1a, and the value "1" is stored in cell No. 1. Likewise, the sequential spin state transfer causes the value stored in cell No. 2 to be transferred to and stored in cell No. 3, and the value stored in cell No. 3 to be transferred to and stored in cell No. 4. The value stored in cell No. 4 is sequentially read by passing the domain wall drive current Id from the second electrode 7 to the first electrode 4.

To write the value "0" in cell No. 1, the value "0" is first set in the second ferromagnetic layer 3. Next, the value "0" set in the second ferromagnetic layer 3 is transferred to cell No. 1.

As shown in FIG. 3(E), when the write current Iw is passed to the left through the first electrode 4, the spin state of the second ferromagnetic layer 3 is switched with the spin arrow being changed from pointing downward to pointing upward by spin-orbit torque generated by the write current Iw. The value "0" is thus set and stored in the second ferromagnetic layer 3. Along with this, a domain wall is formed in the boundary layer 2a, which is located between the second ferromagnetic layer 3 and the first ferromagnetic layer 1a.

As shown in FIG. 3(F), when the pulsed domain wall drive current Id is passed from the second electrode 7 to the first electrode 4, the domain wall formed in the boundary layer 2a moves to the boundary layer 2b, and the domain wall formed in the boundary layer 2c moves to the boundary layer 2d, which is located between the first ferromagnetic layer 1c and the first ferromagnetic layer 1d. Thus, the domain wall motion induced by spin-transfer torque generated by the domain wall drive current Id sequentially transfers the spin state of each of the second ferromagnetic layer 3 and the four first ferromagnetic layers 1 (1a to 1d) to the upper layer shown in the drawing. The spin state of the second ferromagnetic layer 3 is transferred to the first ferromagnetic layer 1a, and the spin state of the first ferromagnetic layer 1a is switched with the spin arrow being changed from pointing downward to pointing upward. The value "0" set in the second ferromagnetic layer 3 is written to the first ferromagnetic layer 1a, and the value "0" is stored in cell No. 1. Likewise, the sequential spin state transfer causes the value stored in cell No. 1 to be transferred to and stored in cell No. 2, the value stored in cell No. 2 to be transferred to and stored in cell No. 3, and the value stored in cell No. 3 to be transferred to and stored in cell No. 4.

By sequentially applying the write operation to the magnetic memory element 10 as described above, a four-bit data of values "0", "1", "1", and "0" in this order can be written in the magnetic memory element 10 comprising four memory cells (cell No. 1 to cell No. 4).

Read of Data

Read of data from the magnetic memory element 10 is done through the insulating film 5 and the third ferromagnetic layer 6. In the present embodiment, the insulating film 5 and the third ferromagnetic layer 6 are disposed above the layer structure 9. For this reason, read of data is done from the first ferromagnetic layer 1d corresponding to cell No. 4. The spin state of the first ferromagnetic layer 1d is read out by measuring the magnitude of the readout current Ir passing through the first ferromagnetic layer 1d, the insulating film 5, and the third ferromagnetic layer 6 using a magnetic tunnel junction. Since the sequential spin state transfer occurs per pulse, a single magnetic tunnel junction is required per memory element 10 to read out the spin state.

In the state of the magnetic memory element 10 shown in FIG. 3(F), the value "0" is first read by measuring the spin state of the first ferromagnetic layer 1d corresponding to cell No. 4 using a magnetic tunnel junction.

Next, the pulsed domain wall drive current Id is passed from the second electrode 7 to the first electrode 4. This causes the spin state to move sequentially to the upper layer in the drawing by domain wall motion induced by spin-transfer torque. The value "0" stored in cell No. 1 is transferred to and stored in cell No. 2, the value "1" stored in cell No. 2 is transferred to and stored in cell No. 3, and the value "1" stored in cell No. 3 is transferred to and stored in cell No. 4. Although the value stored in cell No. 4 is destroyed by passing the pulsed domain wall drive current Id, the value stored in cell No. 4 has already been read using a magnetic tunnel junction before passing the pulsed domain wall drive current Id.

Subsequently, by repeating the read operation comprising the step of measuring the spin state of the first ferromagnetic layer 1d corresponding to cell No. 4 using a magnetic tunnel junction and the step of passing the pulsed domain wall drive current Id from the second electrode 7 to the first electrode 4, the four-bit data of values "0," "1," "1," and "0" in this order can be read from the memory element 10.

In the example of the operation of the magnetic memory element 10 described above, the read of data from the first ferromagnetic layer 1d is a destructive read process similar to that of dynamic random access memories (DRAMs); thus, data may be written again after the read operation.

Configuration of Magnetic Memory Device

Figure 5:
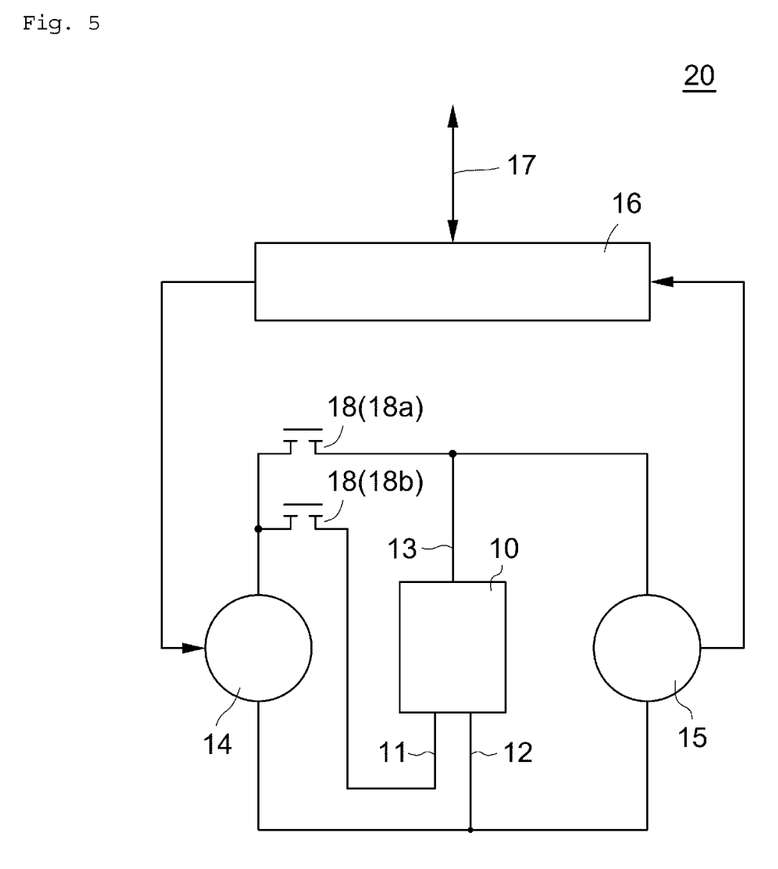
FIG. 5 is a schematic diagram of the configuration of a magnetic memory device according to one embodiment of the present invention.

FIG. 5 is a schematic diagram of the configuration of a magnetic memory device according to one embodiment of the present invention.

The magnetic memory device 20 according to one embodiment comprises a magnetic memory element 10, a current source 14, and a sensor 15.

The current source 14 passes current between the bottom electrode 42a and the bottom electrode 42b of the first electrode 4 of the magnetic memory element 10, and from the second electrode 7 to the first electrode 4. The sensor 15 reads data represented by a spin state stored in the magnetic memory element 10. The sensor 15 can measure the current value of the readout current Ir passing through the magnetic memory element 10 and, from that value, detect the resistance value to read out the spin state in the magnetic memory element. The current source 14 and the sensor 15 are connected to a memory controller 16. The memory controller 16 controls the operation of the current source 14 and the sensor 15 to thus control the write operation to the magnetic memory element 10 and the read operation from the magnetic memory element 10 as explained above with reference to FIGS. 2 and 3. The data read through the sensor 15 is transmitted and received via a data bus 17. The connection from the current source 14 to the first electrode 4 or the second electrode 7 of the magnetic memory element 10 is switched, for example, using switches 18a and 18b. The operation of the switches 18a and 18b is controlled, for example, by the memory controller 16. A plurality of the magnetic memory element 10 may be arranged in an array to form a memory array.

Numerical Simulation Regarding Layer Structure

Figure 6:
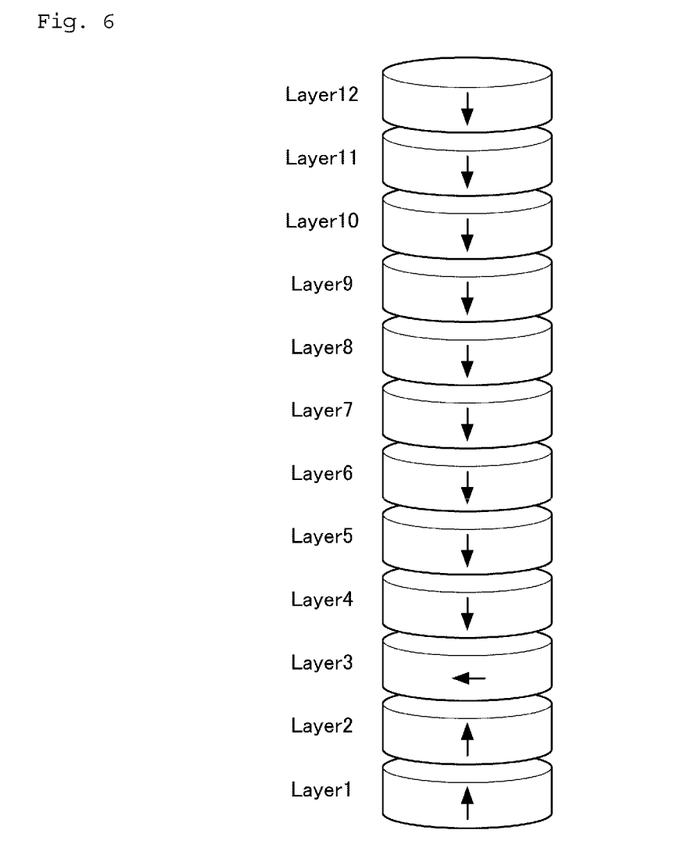
FIG. 6 is a schematic diagram showing the layer structure used for numerical simulation in terms of a magnetic memory element according to one embodiment of the present invention.
Figure 7:
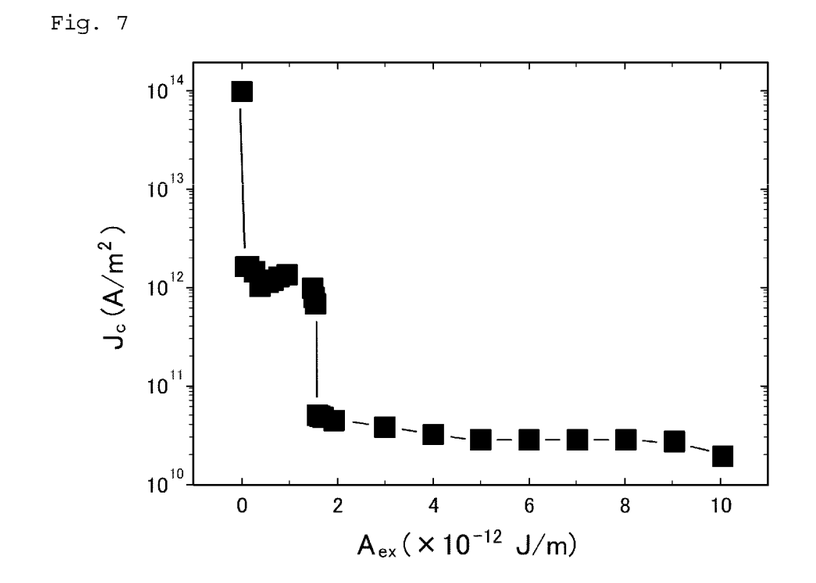
FIG. 7 is a graph showing the results of numerical simulation in terms of the layer structure for a magnetic memory element according to one embodiment of the present invention.

FIG. 6 is a schematic diagram showing the layer structure used for numerical simulation in terms of a magnetic memory element according to one embodiment of the present invention, and FIG. 7 is a graph showing the results of numerical simulation in terms of the layer structure for a magnetic memory element according to one embodiment of the present invention.

The vertical axis of the graph in FIG. 7 represents the current density Jc (A/m$^2$) required to operate the layer structure, while the horizontal axis of the graph represents the magnitude of the ferromagnetic interaction Aex ($\times 10^{12}$ J/m) introduced between the multiple first ferromagnetic layers 1. In the numerical simulation, the magnitude of the current density Jc required for the operation represented by the vertical axis is calculated using the magnitude of the ferromagnetic interaction Aex represented by the horizontal axis as a free parameter.

The conditions of the numerical simulation are as follows. The parameters for the simulation are determined with the assumption of typical materials for MRAMs.

Layer Shape and Size

Each layer has a disk shape with a diameter of 20 nm and a thickness of 3 nm and is formed of a cell (1 nm×1 nm×1 nm).

Number of Layers and Layer Structure

The layer structure shown in FIG. 6 has 12 layers in total. The parameters of the material for each layer are as follows. Below, Ms represents the magnitude of saturation magnetization, Ku represents the magnitude of magnetic anisotropy, and Aex represents the magnitude of ferromagnetic interaction. Since the value of Ku in the domain wall layers is zero, a domain wall is trapped in the domain wall layers instead of the recording layers. This improves the controllability of the location of domain walls.

Layers 3, 5, 7, 9, and 11 (Domain Wall Layers)

Ms=8×10$^5$ [A/m], Ku=0

The domain wall layers corresponds to the boundary layers 2 in the magnetic memory element 10 according to one embodiment of the present invention. The Aex introduced to the domain wall layers is a free parameter in the simulation and corresponds to the horizontal axis of the graph shown in FIG. 7.

Layers 2, 4, 6, 8, 10, and 12 (Recording Layers)

Ms=8×10$^5$ [A/m], Ku=1×10$^6$ [J/m$^3$], Aex=1×10$^{-11}$ [J/m]

The recording layers correspond to the first ferromagnetic layers 1 in the magnetic memory element 10 according to one embodiment of the present invention.

Layer 1 (Pin Layer)

Ms=8×10$^5$ [A/m], Ku=1×10$^7$ [J/m$^3$], Aex=1×10$^{-11}$ [J/m]

The pin layer corresponds to the second ferromagnetic layer 3 in the magnetic memory element 10 according to one embodiment of the present invention.

The graph shown in FIG. 7 is analyzed here. In the graph in FIG. 7 showing the results of numerical simulation, the magnitude of the operating current density Jc is approximately 10$^{14}$ when the value of the ferromagnetic interaction Aex is zero; thus, in conventional magnetic memory elements in which the ferromagnetic interaction Aex is not introduced, the magnitude of the operating current density Jc is in the order of 10$^{14}$. In contrast, in the magnetic memory element 10 according to one embodiment of the present invention, in which the ferromagnetic interaction Aex is introduced between the multiple first ferromagnetic layers 1, the magnitude of the operating current density Jc is in the order of 10$^{10}$. This indicates that introduction of the ferromagnetic interaction Aex between the multiple first ferromagnetic layers 1 can reduce the operating current density Jc to approximately 1/10000, at maximum, of that of the conventional products, or at least about 1/100 of that of the conventional products. The reduction in the operating current density Jc achieves a reduction in the drive current required for domain wall motion and improves the controllability of domain wall motion.

As described above, the present invention provides a layer structure for a magnetic memory element in which the drive current required for domain wall motion is reduced, and the controllability of domain wall motion is improved, and provides a magnetic memory element comprising the layer structure. In the layer structure 9 for the magnetic memory element 10 according to one embodiment, the boundary layer 2 generates the ferromagnetic interaction Aex between the multiple first ferromagnetic layers 1. The ferromagnetic interaction Aex generated between the multiple first ferromagnetic layers 1 achieves a reduction in the drive current required for domain wall motion and improves the controllability of domain wall motion in the magnetic memory element 10.

OTHER EMBODIMENTS

Although the present invention is described above according to a specific embodiment, the present invention is not limited to the embodiment described above.

The number of memory cells in the magnetic memory element 10 is not limited to four, and the magnetic memory element 10 can include a greater number of memory cells.

In the embodiment described above, the boundary layer 2 is formed using a non-magnetic material; however, the material of the boundary layer 2 is not limited to non-magnetic materials. The boundary layer 2, which forms a domain wall, may be formed using a ferromagnetic material of a type different from that of the first ferromagnetic layer 1, or a ferromagnetic material whose composition is different from that of the first ferromagnetic layer 1. For example, a CoFeB alloy may be used to form the first ferromagnetic layer 1, and an elemental metal of cobalt may be used to form the boundary layer 2. In such a case, the boundary layer 2 may be referred to as a "fourth ferromagnetic layer" in the magnetic memory element 10 according to the embodiment described above. Examples of ferromagnetic materials that can be used as materials of the boundary layer 2 include Ni$_{1-x}$Cu$_x$ alloys, Co$_{1-x}$Cu$_x$ alloys, and Co$_{1-x}$Pt$_x$ alloys. As described above, by controlling the composition ratio of these Ni$_{1-x}$Cu$_x$ alloys and Co$_{1-x}$Pt$_x$ alloys, the Curie temperature Tc of the alloys can be controlled, and whether the alloys exhibit properties of ferromagnetic materials or paramagnetic material can be controlled, whereby the magnitude of the ferromagnetic interaction Aex can be controlled. Thus, the alloys whose composition ratios are controlled to exhibit the properties of ferromagnetic materials and to generate an appropriate magnitude of the ferromagnetic interaction Aex can be used as the material of the boundary layer 2.

In the embodiment described above, read of data from the magnetic memory element 10 is a destructive read process; however, the process can be modified to a non-destructive read process by changing the locations of the insulating film 5 and the third ferromagnetic layer 6. For example, a third ferromagnetic layer 6 that has a ring shape and is concentric to the layer structure 9 may be disposed in the center of the height direction of the layer structure 9, and the insulating film 5 may be disposed between the wall of the layer structure 9 and the third ferromagnetic layer 6. According to this structure, the first ferromagnetic layers 1 located below the third ferromagnetic layer 6 in the layer structure 9 can serve as a data buffer.

In the embodiment described above, read of data from the magnetic memory element 10 is done by moving data in each single memory cell with the pulsed domain wall drive current Id and reading the value stored in the memory cell one by one by a magnetic tunnel junction; however, the procedure for reading data from the magnetic memory element 10 is not limited to this. By passing multiple pulsed domain wall drive currents Id, multiple data stored in multiple memory cells can be moved at once, and multiple data can be read sequentially by a magnetic tunnel junction using the domain wall drive current Id. When data are read using current, the time variation of the magnitude of the domain wall drive current Id can be used. If the magnitude of the domain wall drive current Id does not vary with time, then the time variation of the magnitude of the voltage of the magnetic tunnel junction can be used.

In the embodiment described above, the magnetic memory element 10 comprises the insulating film 5, and the spin state of the first ferromagnetic layer 1d is read out by a TMR (tunnel magnetoresistance) effect; however, the method for reading out the spin state of the first ferromagnetic layer 1d is not limited to this. For example, a layer of a non-magnetic metal, such as copper, may be provided, instead of the insulating film 5, in the magnetic memory element to read out the spin state of the first ferromagnetic layer 1d by a GMR (giant magnetoresistance) effect. The use of the GMR effect in the readout of the spin state allows a relatively large current to pass through.

In the embodiment described above, the structure of the magnetic memory element 10 is a three-dimensional structure with various layers stacked vertically; however, the structure of the magnetic memory element can also have a structure with a region corresponding to the various layers arranged horizontally to be mounted on a plane. The layer structure recited in the claims not only means a three-dimensional structure with various layers stacked vertically, but also means a structure with a region corresponding to the various layers arranged horizontally to be mounted on a plane as stated above.

DESCRIPTION OF THE REFERENCE NUMERALS 1 (1a to 1d) First ferromagnetic layers
2 Boundary layer
3 Second ferromagnetic layer
4 First electrode
5 Insulating film
6 Third ferromagnetic layer
7 Second electrode
9 Layer structure
10 Magnetic memory element
11 to 13 Terminals
14 Current source
15 Sensor
16 Memory controller
17 Data bus
18 (18a, 18b) Switches
20 Magnetic memory device
41 Spin-orbit torque layer
42 (42a, 42b) Bottom electrodes
Aex Ferromagnetic interaction
Id Domain wall drive current
Iw Write current
Ir Readout current

The invention claimed is:

1. A layer structure for a magnetic memory element comprising
    multiple first ferromagnetic layers with a switchable spin state, and
    boundary layers each disposed between each pair of the multiple first ferromagnetic layers to form a domain wall,
    the boundary layers being for generating ferromagnetic interaction between the multiple first ferromagnetic layers,
    wherein the boundary layers are formed using a ferromagnetic material different from the first ferromagnetic layers.

2. A magnetic memory element comprising:
    multiple first ferromagnetic layers with a switchable spin state,
    boundary layers each disposed between each pair of the multiple first ferromagnetic layers to form a domain wall,
    the boundary layers being for generating ferromagnetic interaction between the multiple first ferromagnetic layers,
    a second ferromagnetic layer with a switchable spin state disposed on one side of the first ferromagnetic layers, via one of the boundary layers,
    a first electrode disposed adjacent to the second ferromagnetic layer to switch the spin state of the second ferromagnetic layer by spin-orbit torque, and
    a second electrode disposed on another side of the first ferromagnetic layers that is most distant from the one side.

3. The magnetic memory element according to claim 2, wherein the second ferromagnetic layer has coercivity higher than that of the first ferromagnetic layers.

4. The magnetic memory element according to claim 2, further comprising
    an insulating film disposed between one of the first ferromagnetic layers on the another side that is most distant from the one side and the second electrode, and
    a third ferromagnetic layer with a fixed spin state disposed between the insulating film and the second electrode,
    wherein the spin state of the one of the first ferromagnetic layers on the another side is read out through the second electrode.

5. A magnetic memory device comprising
    the magnetic memory element of claim 4,
    a current source for passing a current through the first electrode, and from the second electrode to the first electrode, and
    a sensor for reading data that is represented by a spin state and that is stored in the magnetic memory element.

6. A method for storing data represented by a spin state in the magnetic memory element of claim 4, comprising
    passing a current through the first electrode to set a spin state of the second ferromagnetic layer by spin-orbit torque, and
    passing a current between the second electrode and the first electrode to transfer the spin state of the second ferromagnetic layer to one of the first ferromagnetic layers on one side by spin-transfer torque.

* * * * *